United States Patent
Narayanan et al.

(10) Patent No.: US 10,248,150 B2
(45) Date of Patent: Apr. 2, 2019

(54) SLOPE ENHANCEMENT CIRCUIT FOR SWITCHED REGULATED CURRENT MIRRORS

(71) Applicant: Dialog Semiconductor (UK) Limited, London (GB)

(72) Inventors: Shyam Narayanan, Germering (DE); Fulvio Schiappelli, Pullach im Isartal (DE)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/653,160

(22) Filed: Jul. 18, 2017

(65) Prior Publication Data
US 2019/0025865 A1 Jan. 24, 2019

(51) Int. Cl.
| | |
|---|---|
| *G05F 3/26* | (2006.01) |
| *H03K 5/08* | (2006.01) |
| *H03M 1/70* | (2006.01) |
| *H03F 3/195* | (2006.01) |
| *H03F 3/45* | (2006.01) |
| *H03K 5/007* | (2006.01) |
| *H03F 3/50* | (2006.01) |

(52) U.S. Cl.
CPC ............ *G05F 3/262* (2013.01); *H03F 3/195* (2013.01); *H03F 3/45955* (2013.01); *H03F 3/505* (2013.01); *H03K 5/007* (2013.01); *H03K 5/082* (2013.01); *H03M 1/70* (2013.01)

(58) Field of Classification Search
CPC ............ H02M 3/10; H02M 3/155; H02M 3/156–3/158; H02M 3/1588; G05F 3/262; G05F 3/265; G05F 3/30; H03F 3/195; H03F 3/45955; H03F 3/505; H03K 5/007; H03K 5/082; H03M 1/70; Y02B 70/1466
USPC .................. 323/224, 283, 290, 315
See application file for complete search history.

(56) References Cited

U.S. PATENT DOCUMENTS

| | | | |
|---|---|---|---|
| 5,079,453 | A | 1/1992 | Tisinger et al. |
| 7,372,238 | B1 | 5/2008 | Tomiyoshi |
| 9,392,661 | B2 * | 7/2016 | Schiappelli ........ H05B 33/0815 |
| 9,451,664 | B2 | 9/2016 | Jin et al. |
| 2005/0281057 | A1 | 12/2005 | Jung et al. |
| 2006/0125673 | A1 * | 6/2006 | Lee ........................ H03K 4/50 |
| | | | 341/155 |

(Continued)

FOREIGN PATENT DOCUMENTS

KR    100174514    4/1999

*Primary Examiner* — Yemane Mehari
(74) *Attorney, Agent, or Firm* — Saile Ackerman LLC; Stephen B. Ackerman (57) ABSTRACT

An object of the disclosure is to provide a slope enhancement circuit, comprising an amplifier and a specific arrangement of capacitors and switches, further comprising a current digital to analog converter (IDAC), in a switched regulated current mirror. A method of sample and hold exploits the transient dynamics of the switched current mirror, to enhance the output current slope during PWM operation. A further object of the disclosure is to provide a low power, high speed switching type of regulated current mirror architecture. Still further, another object of the disclosure is to provide quick response to a sudden demand in current with a high degree of accuracy. Still further, another object of the disclosure is to provide a significant savings in circuit area.

21 Claims, 8 Drawing Sheets

(56) References Cited

U.S. PATENT DOCUMENTS

| | | | |
|---|---|---|---|
| 2007/0103001 A1* | 5/2007 | Chiozzi | H03K 17/04106 |
| | | | 307/10.1 |
| 2007/0285073 A1 | 12/2007 | Nishida | |
| 2007/0296389 A1 | 12/2007 | Chen et al. | |
| 2012/0249237 A1* | 10/2012 | Garrity | H03F 3/005 |
| | | | 330/127 |
| 2014/0132236 A1 | 5/2014 | Darmawaskita et al. | |
| 2015/0115922 A1 | 4/2015 | Liu et al. | |

* cited by examiner

SLOPE ENHANCEMENT CIRCUIT FOR SWITCHED REGULATED CURRENT MIRRORS

BACKGROUND

Field

The disclosure relates generally to switched regulated current mirrors.

Description

Figure 1:
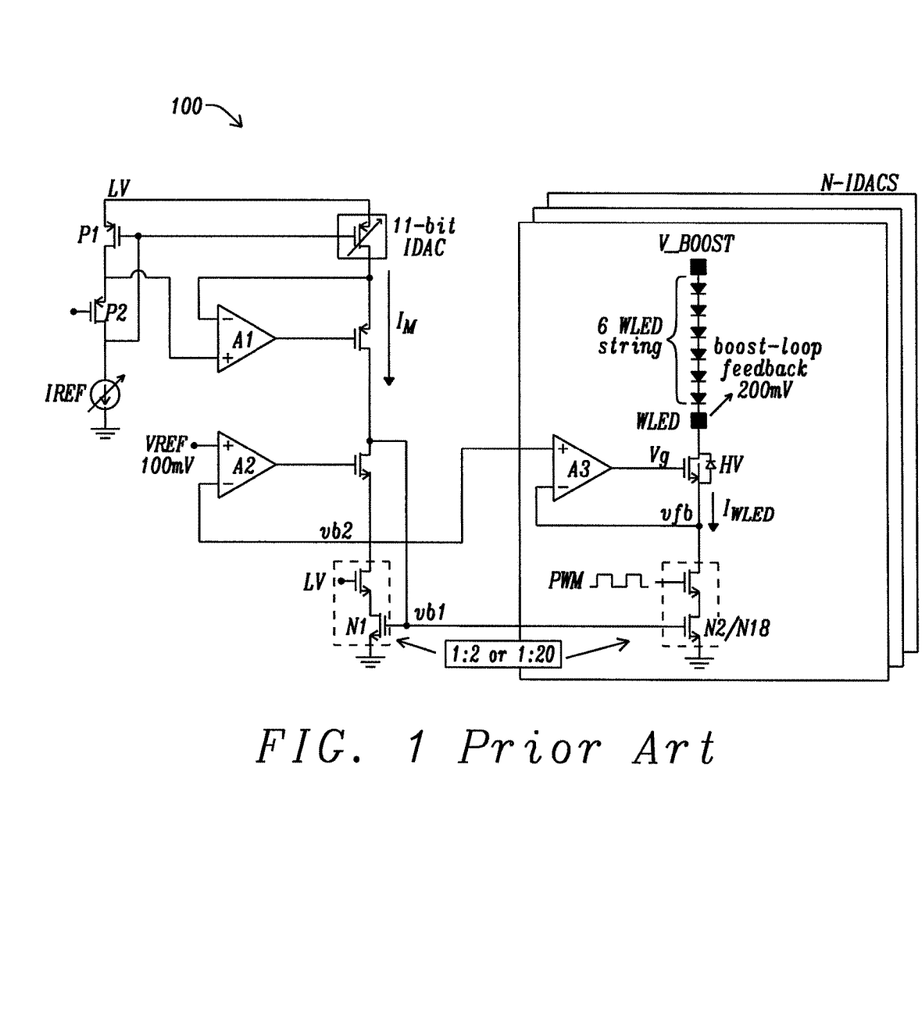
FIG. 1 depicts a regulated current mirror type architecture used in existing IDAC designs, of the prior art.

FIG. 1 depicts regulated current mirror type architecture 100, used in existing current digital to analog converter (IDAC) designs, of the prior art, as shown in U.S. Pat. No. 9,392,661, owned by a common assignee with the instant application, and which is herein incorporated by reference in its entirety. The IDAC has a "pseudo-thermometric" current DAC made of PMOS transistors P1 and P2. This provides a reference current IREF, which is mirrored by "N" number of IDAC string drivers with a ratio of 1:2 or 1:20, to set the current in the white light emitting diode (WLED) strings as shown. The matrix output of the PMOS current DAC is variable and controlled by a 11-bit digital code.

The pulse-width modulation (PWM) scheme of FIG. 1 is designed for low voltage operation down to and below 200 mV. The DAC is designed to be unary/thermometric made of PMOS current sources P1 and P2, in which the output current Im varies with the input code in a binary fashion.

With the PWM scheme implemented in FIG. 1, the enable/disable switches N1 and N2/N18 can be switched on and off with the PWM signal, in series with each current sink branch. For the PWM circuitry to work this way, there needs to be a specific arrangement of capacitors and switches, timed precisely to guarantee PWM accuracy. The variable current controlled by the digital code is generated by a PMOS current source, mirrored by a factor of 2 or 20, with NMOS transistor mirrors in the sink stage. Turning on and off these fixed mirrors is relatively easy. To do the same on and off operation on a binary weighted DAC having 2500+ transistors controlled by the digital code, further increases the complexity of achieving the required PWM accuracy, due to large transients during switching.

SUMMARY

An object of the disclosure is to provide a slope enhancement circuit, comprising an amplifier and a specific arrangement of capacitors and switches, further comprising a current digital to analog converter (IDAC), and an NMOS current sink, in a switched regulated current mirror. A method of sample and hold exploits the transient dynamics of the current mirror, to enhance the output current slope during PWM operation.

A further object of the disclosure is to provide a low power, high speed switching type of regulated current mirror architecture.

Still further, another object of the disclosure is to provide quick response to a sudden demand in current with a high degree of accuracy.

Still further, another object of the disclosure is to provide a significant savings in circuit area.

To accomplish the above and other objects, a slope enhancement circuit for a switched regulated current mirror is disclosed, comprising a slope enhancement circuit in a switched regulated current mirror, comprising an operational amplifier, where a non-inverting input is configured to receive a reference voltage, and an inverting input is configured to receive a feedback voltage, further comprising a first, second, and third switch, where the first switch is connected between an output of the amplifier and the second switch, the second switch is connected to a gate of an NMOS follower, and the third switch is connected between the gate of the NMOS follower and ground, and further comprising a first and second capacitor, where the first capacitor is connected to the output of the operational amplifier, and the second capacitor is connected to a junction of the first switch and the second switch.

The above and other objects are further achieved by a method for a slope enhancement circuit in a switched regulated current mirror. The steps include providing an operational amplifier, where a non-inverting input receives a reference voltage, and an inverting input receives a feedback voltage. The steps also include providing an NMOS follower. The steps also include charging a first capacitor to the supply voltage, when a pulse width modulation (PWM) signal is inactive, and discharging the first capacitor when the PWM signal is active. The steps also include charging a second capacitor to a gate voltage of the follower. The steps also include charging a third capacitor to the gate voltage of the follower when the PWM signal is active, and discharging the third capacitor when the PWM signal is inactive.

In various embodiments the slope enhancement circuit may be achieved using a regulated supply voltage and an additional switch.

In various embodiments the slope enhancement circuit may be achieved using a regulated supply voltage, an additional switch, and a capacitor.

DETAILED DESCRIPTION

The primary technical objective to be achieved is to disclose a slope enhancement circuit, comprising an amplifier, capacitors, switches, a current digital to analog converter (IDAC), which acts as an NMOS current sink, further comprising an NMOS device. A method of sample and hold exploits the transient dynamics of a current mirror, to enhance the output current slope during PWM operation.

Figure 2:
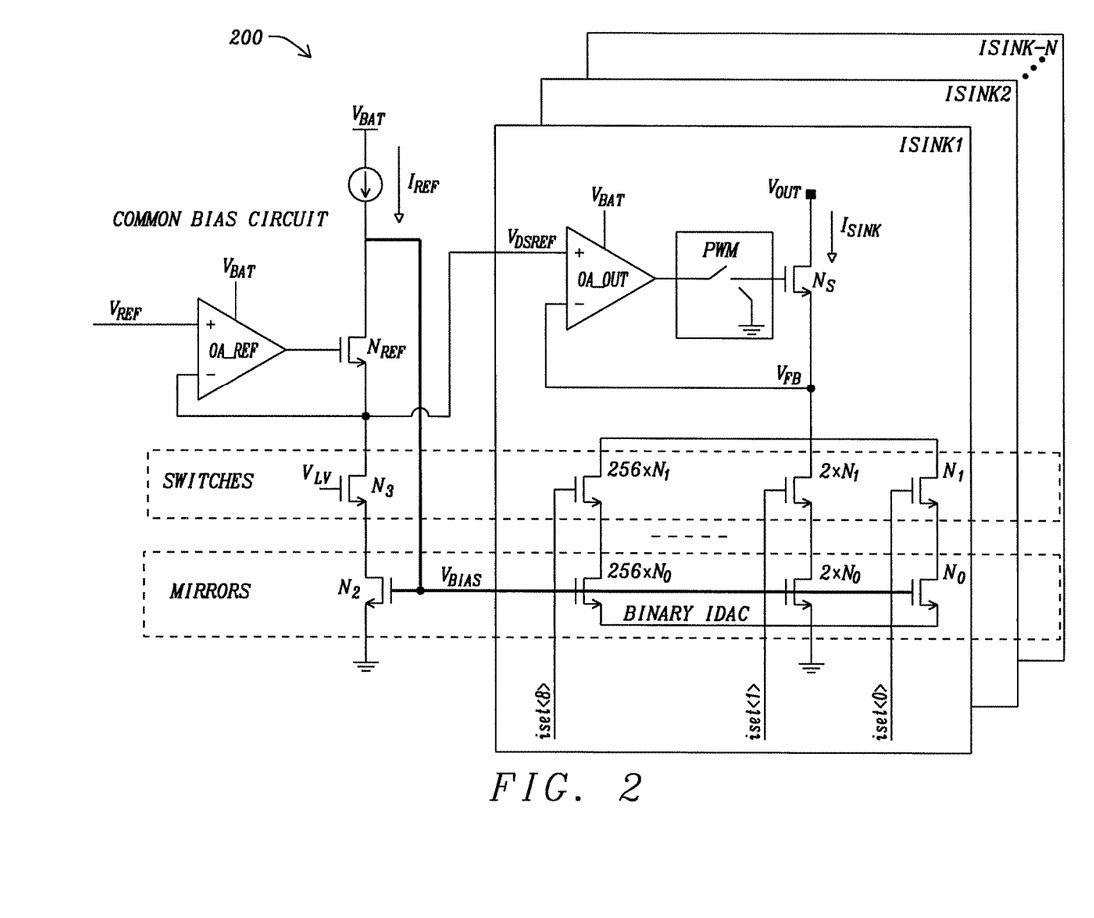
FIG. 2 consists of pulse width modulation (PWM) based switching of output current in a regulated type of current sink architecture.

The proposed disclosure implements a current sink architecture, which is an improvement on the prior art architecture in FIG. 1, and used for a completely different application. In the new architecture, there are several changes made to be compliant with various boundary conditions like low-power design and area utilization. Among the changes is the PWM scheme, which complies with the multiple variants of PWM mode, which can be supported by the proposed current sink architecture. The fundamental difference between the prior art architecture and the new architecture is the type of DAC, where the DAC of the disclosure is designed with NMOS transistors in saturation, acting as current sinks. The underlying concept is to exploit the dynamics of the system during PWM operation, using the existing low performance op-amp to charge a capacitor during PMW off, and making the capacitor redistribute charge quickly, responding to current demand when PWM turns on. One such implementation is described in FIG. 2. The architecture described in FIG. 2 is a variant of U.S. Pat. No. 9,392,661, where the fixed mirror ratio of 2 or 20 is replaced with a binary weighted current sinks.

FIG. 2 consists of PWM based switching of output current 200, in a regulated type of current sink architecture. The circuit of FIG. 2 consists of low speed amplifiers OA_REF and OA_OUT used for regulation. There are several ways to switch the output current in the regulated current sink, and the current sink may need to support low voltage operation down to 200 mV. Since the NMOS sinks work in saturation with tight saturation voltage Vdsat margins, to comply with low Vout requirements, transistor Ns needs to support the maximum current under all extreme conditions. This becomes a major factor in determining the die area of the circuit. Adding any series switch, in the main current path with Ns, costs significant circuit area for very low voltage overhead, where Vout<200 mV. In this implementation, Ns would need to work with half the drain to source voltage Vds, along with any transistor added in series with it. This results in an increased die area and an increased cost.

Another solution to accomplish the PWM operation is to incorporate the regulation and switching function into one ISINKN, by opening and closing regulation loop switch PWM, built around the op-amp OA_OUT and follower Ns. A fundamental issue with opening and closing the regulation loop in this manner is the slew rate and bandwidth limitation of the op-amp. Due to low-power design requirements, the overall current consumption of the op-amp was reduced by a factor of 10 from existing known design. With such low bias current, it would be very difficult to achieve a high slew rate and bandwidth without adding further complexity. Since follower Ns is sized to carry the maximum current, the switch contributes significant area to the circuit and has a relatively large capacitance at its gate which has to be driven by op-amp OA_OUT.

Figure 3:
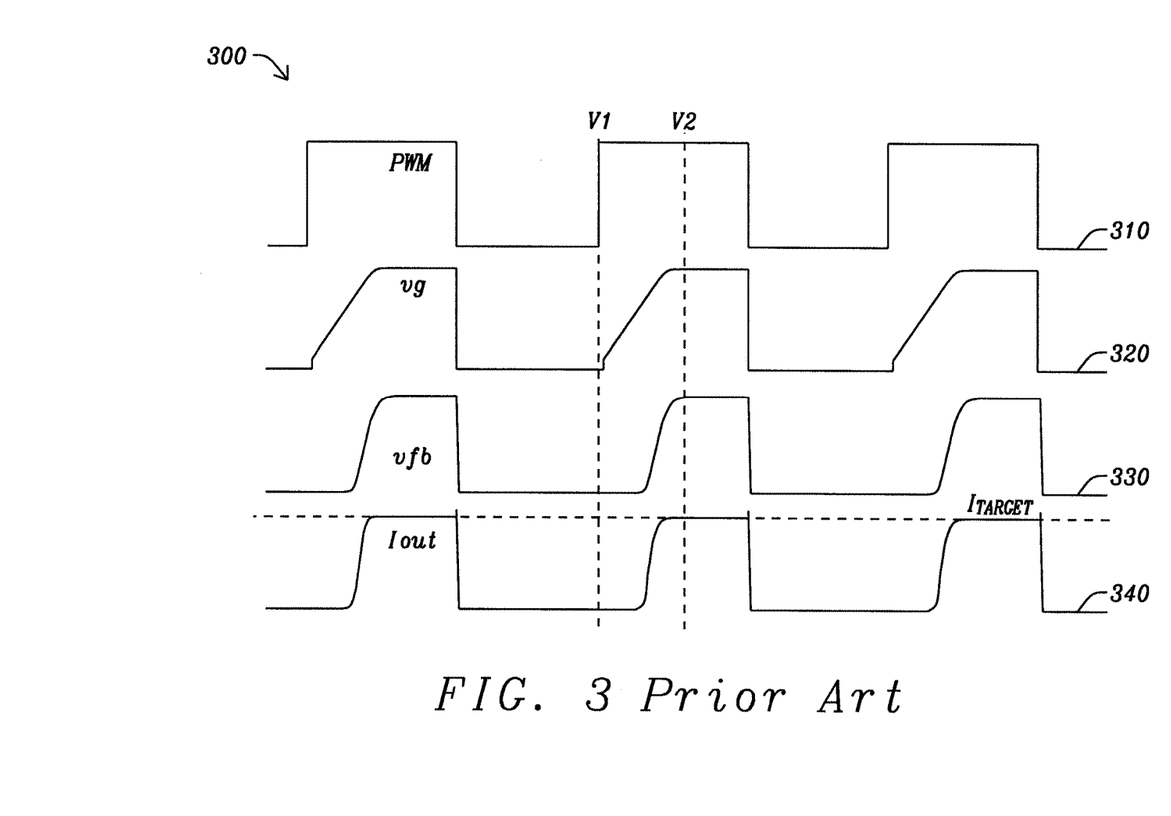
FIG. 3 shows the timing diagram response of a switched regulated current mirror when a PWM pulse is applied to the gate of a follower device in current sink architecture, known to the inventor.

FIG. 3 shows the timing diagram response of switched regulated current mirror 300, when a PWM pulse is applied to the gate of the follower in current sink architecture, known to the inventor. The resulting response is shown for signal PWM 310, with switching device Ns, and current sink output current Iout 340. Vg 320 represents the gate voltage of device Ns, and Vfb 330 represents the feedback voltage to the inverting input of amplifier OA_OUT, the source of device Ns. V1-V2 represents the difference from when the PWM pulse signal turns on to when output current Iout reaches Itarget. The system responds very slowly when the output of amplifier OA_OUT, designed for low bandwidth and a low slew-rate, is opened and closed with the PWM pulse signal. The output current reaches its target value Itarget approximately 50% of the on time, and this makes the average value of the current completely off from the expected value, determined by the duty cycle of PWM.

Figure 4:
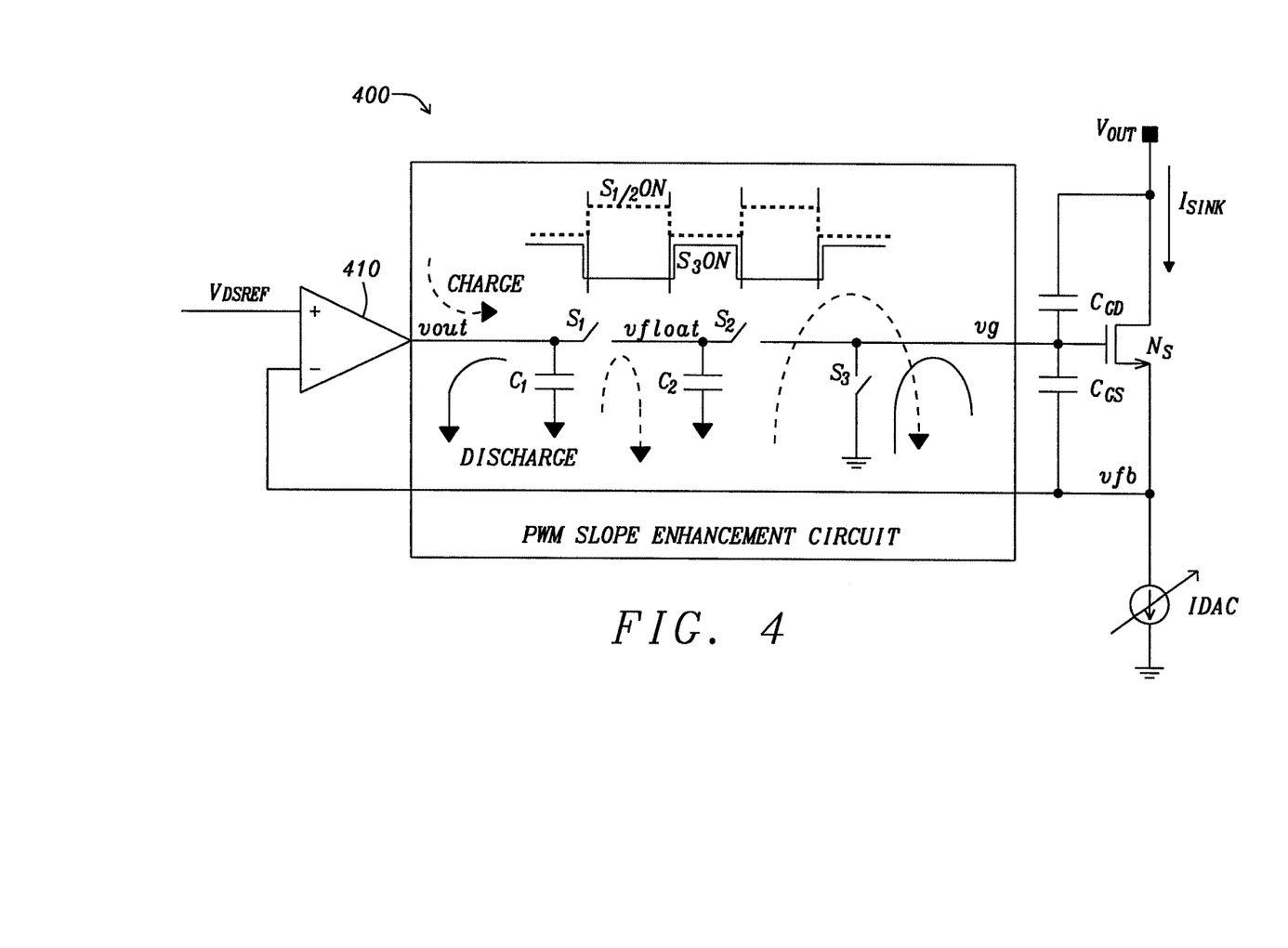
FIG. 4 shows the pulse width modulation (PWM) slope enhancement circuit, embodying the principles of the disclosure.

FIG. 4 shows pulse width modulation (PWM) slope enhancement circuit 400, embodying the principles of the disclosure. The circuit comprises operational amplifier 410, with a non-inverting input connected to reference voltage Vdsref, and an inverting input connected to feedback voltage Vfb. Switch S1 and capacitor C1 are connected to amplifier output Vout. Switch S2 and capacitor C2 are connected to the input of switch S1, at a floating node Vfloat. Switch S3 is connected across the gate of NMOS follower Ns of the current sink, between the output of switch S2, and ground. The gate-drain capacitance CGD and gate-source capacitance CGS of device Ns are shown. A current digital to analog converter (IDAC) is configured between the source of Ns and ground.

When the PWM signal is active, switches S1 and S2 are closed, charging capacitors C1, C2 and CGS. When the PWM signal is active, S3 is open, driven by the inverted version of the PWM signal. Looking at the transient behavior when switches S1 and S2 close, capacitors C1 and C2, and eventually gate capacitor CGS, are charged to the required gate voltage Vg of Ns, and support the current set by the IDAC in equilibrium. Here, the PWM signal being described as 'active' can be taken to mean when the voltage is high, and conversely, 'inactive' can be taken to mean when the voltage is low. It will be well understood by one of ordinary skill that active and inactive could refer to low, and high, voltages, respectively.

When switches S1 and S2 open, the gate of Ns is pulled down to ground by switch S3, by discharging capacitor CGS and leaving capacitor C2 floating. With capacitor C2 floating its charge is held, maintaining Vgs during PWM inactive. This is designed to reduce the overshoot during the next cycle, during a high supply voltage Vdd condition. When the current flow in Ns is disrupted, Ns acts as a switch, and current sink below forces feedback voltage Vfb to zero. This results in the output of the op-amp going to the value of the supply voltage. As a result capacitor C1 is pulled up to Vdd, and holds this charge during PWM inactive.

In the next cycle when switches S1 and S2 close and switch S3 opens, capacitor C1, which has been charged to Vdd, is discharged by redistributing the charge to capacitors C2 and CGS. This rapidly charges the gate voltage of device Ns. This creates a "controlled" configuration, where initially the circuit is open loop during transient, and once all nodes are charged to the required operating point, op-amp 410 of the regulation loop comes into control.

The digital controller of the chip generates the timing signals of the slope enhancement circuit such that switches S1, S2, and S3 are carefully controlled during the transitions of PWM turning off and on.

Figure 5:
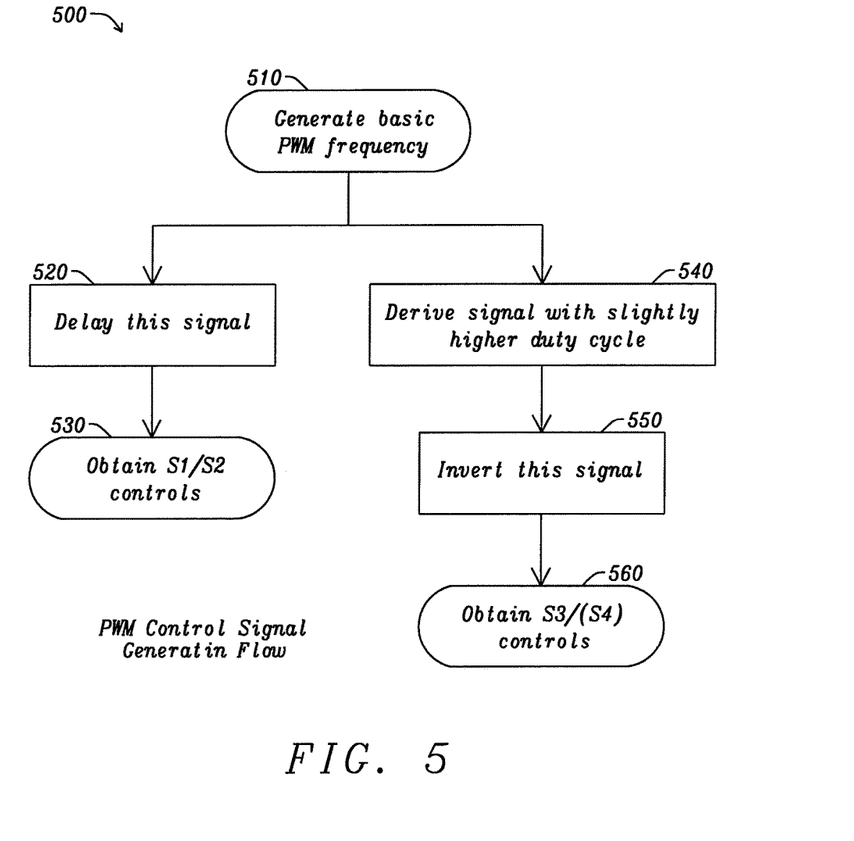
FIG. 5 illustrates a flow chart for the PWM control signal generation flow, embodying the principles of the disclosure.

FIG. 5 illustrates flow chart 500 for the PWM control signal generation flow, embodying the principles of the disclosure. The basic PWM frequency is generated in 510. The PWM signal is delayed in 520, and a signal with a slightly higher duty cycle is derived in 540. The delayed PWM signal is used for switch S1 and S2 controls in 530, which turn on with the PWM signal. The slightly higher duty cycle signal is inverted in 550, and dis used for switch S3 and variant S4 controls in 560, which turn on with PWM turning off.

Figure 6:
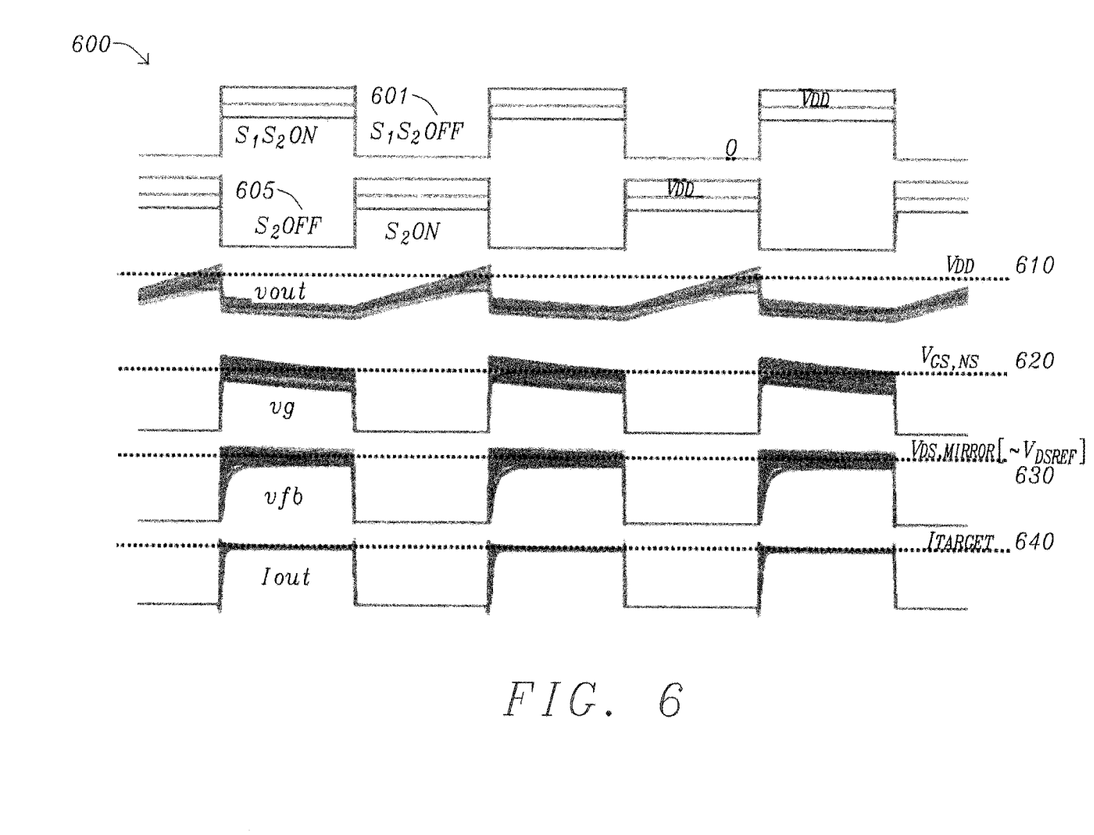
FIG. 6 shows the simulation waveforms for node voltages and currents during pulse width modulation (PWM) of the disclosure for process, voltage and temperature ranges.

FIG. 6 shows simulation waveforms 600 for node voltages and currents for the slope enhancement circuit of the disclosure, for all process, voltage and temperature ranges. The waveforms show that Iout output current 640 is nearly a perfect square-pulse, following closely PWM signal 601, for the various operating conditions. This guarantees that average output current Itarget, determined by the duty cycle of the PWM signal, reaches its target value approximately 100% of the on time.

Vg 620 represents the gate voltage of follower Ns, and Vfb 630 represents the feedback voltage, at the source of the follower Ns, or Vds,mirror of the switched regulated current mirror. When the PWM signal is high, switch S3 is open, and when the PWM signal is low, switch S3 is closed, as seen in 605.

Without the slope-enhancement circuit of the disclosure, the output would slew very slowly, causing the output current to be extremely off from the specification. The waveforms of FIG. 6 represent the slope-enhancement circuit optimized for a specific current at which PWM is performed in the application, set by the IDAC code. Note that the simulation covers extreme supply voltages and temperature ranges, as well as different process corner operating conditions.

Figure 7:
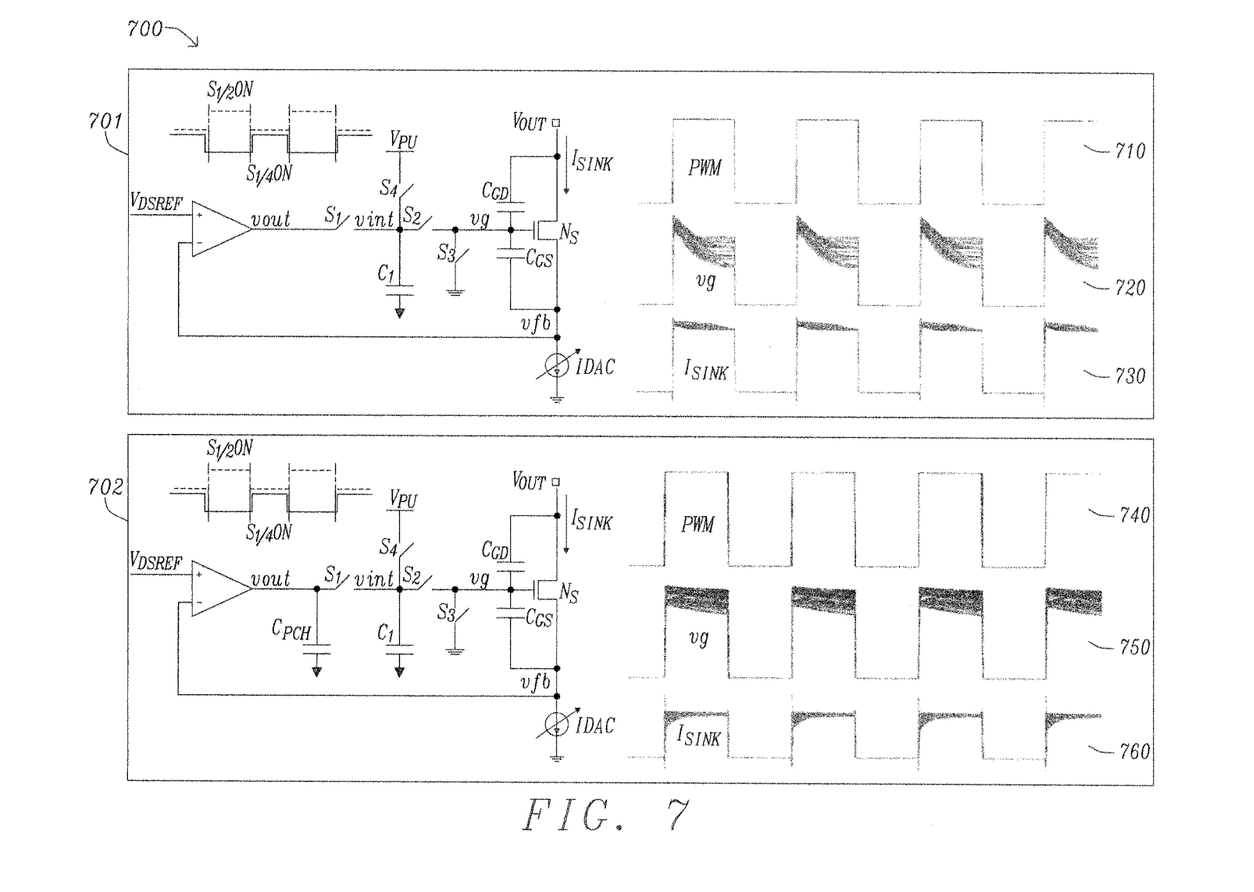
FIG. 7 shows variants of the slope enhancement circuit along with simulation results, using an additional switch and capacitor stage, for reduced dependency on the supply voltage of the amplifier.

FIG. 7 shows 700, variants of the slope enhancement circuit along with simulation results, using an additional switch and capacitor stage, for a reduced dependency on the supply voltage of the amplifier. In 701, adding pull up switch S4 across regulated supply Vpu and capacitor C1 eliminates the supply voltage Vdd dependency of the capacitor. In this variant, C1 is pulled up to regulated supply Vpu instead of Vdd, ensuring smooth operation under all supply voltage conditions. In 702, adding optional capacitor CPCH depends on the magnitude of available regulated supply voltage Vpu. For a sufficiently high value of Vpu, capacitor CPCH may be eliminated.

Using the slope enhancement circuit of the disclosure allows a relatively low speed amplifier to quickly respond to a changing PWM signal. The precise value of capacitor C1 to optimize the slope of the output current is based on the use-case scenario of the application, for example the frequency of the PWM signal and its settling requirements.

Figure 8:
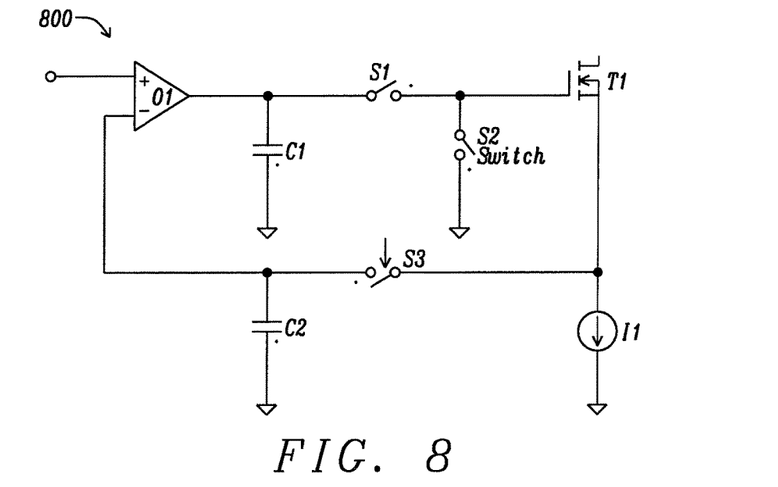
FIG. 8 illustrates another possible variant to the slope enhancement circuit, using a regulated power supply to pull up a first capacitor instead of a standard supply keeping the amplifier in balance without swinging from rail to rail.

FIG. 8 illustrates 800, another possible variant to the slope enhancement circuit, using a regulated power supply to pull up a first capacitor instead of a standard supply, keeping the amplifier in balance without swinging from rail to rail. Here capacitor C1 is much larger than capacitor CGS of FIG. 4, and when PWM is off capacitors C1 and C2 hold their charge. When switches S1 and S2 close, operational amplifier O1 of the regulation loop comes into control. Reference voltage Vdsref, which drives the non-inverting input of the operational amplifier, and follower T1, IDAC I1, and switch S3, across capacitor C2 and I1, are included. This configuration works especially well for continuous switching of PWM pulses.

This configuration may not be preferred when the application demands a continuous train of pulses, a sudden burst of pulses for n-number of cycles, or a single pulse and then the system goes off for a very long time. After a very long wait time, there could be a sudden demand in current with one single pulse, burst of pulses, or continuous pulses. During a very long wait time, when the current sink is not working, capacitors C1 and C2 may discharge due to leakage of the switches. When the application demands current with one single pulse, this configuration may not be ideal, due to capacitor C1 being very large and taking time to charge up from zero, causing the one pulse that the application might need to be missed. In that case, the configuration of FIG. 4 or its variations shown in FIG. 7 would be preferred.

Figure 9:
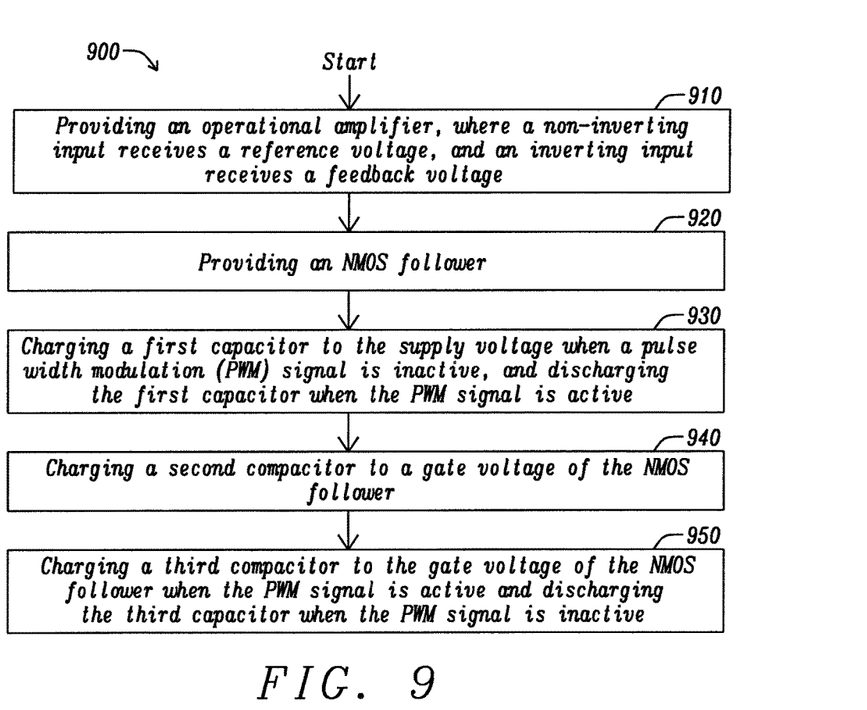
FIG. 9 is a flow chart of a method for a slope enhancement circuit in a switched regulated current mirror.

FIG. 9 is flow chart 900 of a method for a slope enhancement circuit in a switched regulated current mirror. The steps include 910, providing an operational amplifier, wherein a non-inverting input receives a reference voltage, and an inverting input receives a feedback voltage. The steps also include 920, providing an NMOS follower. The steps also include 930, charging a first capacitor to said supply voltage, when a pulse width modulation (PWM) signal is inactive, and discharging said first capacitor when said PWM signal is active, and 940, charging a second capacitor to a gate voltage of said follower. The steps also include 950, charging a third capacitor to said gate voltage of said follower when said PWM signal is active, and discharging said third capacitor when said PWM signal is inactive.

The advantages of one or more embodiments of the present disclosure include a slope enhancement circuit for a switched regulated current mirror, with a significant savings in circuit area and power. The slope enhancement circuit is able to quickly respond to the current demand of the switched regulated current mirror with a high degree of accuracy.

While this invention has been particularly shown and described with reference to the preferred embodiments thereof, it will be understood by those skilled in the art that various changes in form and details may be made without departing from the spirit and scope of the invention.

The invention claimed is:

1. A slope enhancement circuit in a switched regulated current mirror, comprising:
    an operational amplifier, wherein a non-inverting input is configured to receive a reference voltage, and an inverting input is configured to receive a feedback voltage;
    a first, second, and third switch, wherein said first switch is connected between an output of said operational amplifier and said second switch, said second switch is connected to a gate of an NMOS follower, and said third switch is connected between said gate of said follower and ground; and
    a first and second capacitor, wherein said first capacitor is connected to said output of said operational amplifier, and said second capacitor is connected to a junction of said first switch and said second switch.

2. The circuit of claim 1, wherein said NMOS follower has a drain connected to an output and a source connected at said inverting input of said operational amplifier.

3. The circuit of claim 2, wherein a current digital to analog converter (IDAC) is configured between said source of said follower and ground.

4. The circuit of claim 3, wherein said first and said second switches are configured to be closed by a pulse-width modulation (PWM) signal, when said PWM signal is active, so that said first and second capacitors charge said gate of said NMOS follower, to support a current set by said IDAC.

5. The circuit of claim 4, wherein said third switch is configured to be driven by an inverted PWM signal, and configured to open when said PWM signal is active.

6. The circuit of claim 4, wherein said first and second switches are configured to open, and said third switch is closed, when said PWM signal is inactive.

7. The circuit of claim 6, wherein said gate of said follower is configured to be pulled down to ground by said third switch, and wherein its gate-to-source capacitance is discharged when said PWM signal is inactive.

8. The circuit of claim 6, wherein said second capacitor is configured to float when said second switch is open.

9. The circuit of claim 6, wherein a voltage of said gate of said follower is maintained when said PWM signal is inactive.

10. The circuit of claim 1, wherein said follower is configured to turn off, wherein said feedback voltage is forced to zero, and said output of said operational amplifier is configured to a supply voltage, when said PWM signal is inactive.

11. The circuit of claim 9, where said first capacitor is configured to be pulled up to said supply voltage when said PWM signal is inactive.

12. A slope enhancement circuit in a switched regulated current mirror, comprising:
   an operational amplifier, wherein a non-inverting input is configured to receive a reference voltage, and an inverting input is configured to receive a feedback voltage;
   a first, second, third, and fourth switch, wherein said first switch is connected between an output of said operational amplifier and said second switch, said second switch is connected to a gate of an NMOS follower, said third switch is connected between said gate of said follower and ground, and said fourth switch is connected between a regulated supply voltage and said second switch; and
   a first capacitor connected to a junction of said first switch and said second switch.

13. The circuit of claim 12, further comprising a second capacitor connected to said output of said operational amplifier and said first switch.

14. A method for enhancing a slope of an output current signal for a switched regulated current mirror, comprising the steps of:
   providing an operational amplifier, wherein a non-inverting input receives a reference voltage, and an inverting input receives a feedback voltage;
   providing an NMOS follower;
   charging a first capacitor to said supply voltage, when a pulse width modulation (PWM) signal is inactive, and discharging said first capacitor when said PWM signal is active;
   charging a second capacitor to a gate voltage of said follower; and
   charging a third capacitor to said gate voltage of said follower when said PWM signal is active, and discharging said third capacitor when said PWM signal is inactive.

15. The method of claim 14, wherein a first and a second switch close when said PWM signal is active, so that said first and second capacitors charge said gate of follower, supporting a current set by an IDAC.

16. The method of claim 15, wherein a third switch is driven by an inverted PWM signal, and opens when said PWM signal is active.

17. The method of claim 16, wherein said first and second switches open, and said third switch closes, when said PWM signal is inactive.

18. The method of claim 17, wherein said gate of said follower is pulled down to ground by said third switch, and wherein its gate-to-source capacitance discharges when said PWM signal is inactive.

19. The method of claim 17, wherein said second capacitor floats when said second switch opens.

20. The method of claim 17, wherein a voltage of said gate of said follower maintains a value when said PWM signal is inactive.

21. The method of claim 17, wherein said follower turns off, wherein said feedback voltage goes to zero, and said output of said operational amplifier is said supply voltage, when said PWM signal is inactive.

* * * * *